United States Patent
Sayilir et al.

(10) Patent No.: US 11,716,071 B2
(45) Date of Patent: Aug. 1, 2023

(54) AREA EFFICIENT N-PATH FILTER

(71) Applicant: Realtek Semiconductor Corp., Hsinchu (TW)

(72) Inventors: Serkan Sayilir, San Jose, CA (US); Poh-boon Leong, Pleasanton, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/540,346

(22) Filed: Dec. 2, 2021

(65) Prior Publication Data
US 2023/0179174 A1  Jun. 8, 2023

(51) Int. Cl.
  *H03K 5/00* (2006.01)
  *H03H 7/00* (2006.01)
  *H03H 11/04* (2006.01)
  *H03F 3/19* (2006.01)
  *H03K 17/687* (2006.01)

(52) U.S. Cl.
  CPC ........ *H03H 11/04* (2013.01); *H03K 17/6872* (2013.01)

(58) Field of Classification Search
  None
  See application file for complete search history.

(56) References Cited

U.S. PATENT DOCUMENTS

| | | | | | |
|---|---|---|---|---|---|
| 5,459,424 | A | * | 10/1995 | Hattori | H03K 5/133 327/288 |
| 5,774,403 | A | * | 6/1998 | Clark, II | G11C 7/22 365/194 |
| 6,845,458 | B2 | * | 1/2005 | Lin | H03L 7/087 713/400 |
| 7,196,379 | B2 | * | 3/2007 | Morishita | H01L 27/0811 257/357 |
| 8,044,696 | B2 | * | 10/2011 | Kim | H03K 5/133 327/261 |
| 8,203,371 | B2 | * | 6/2012 | Jeon | H03K 5/133 327/263 |
| 8,354,863 | B2 | * | 1/2013 | Lee | G11C 11/24 327/51 |
| 10,776,550 | B1 | * | 9/2020 | Chen | G06F 30/39 |
| 2007/0008023 | A1 | * | 1/2007 | Wang | H03K 5/133 327/276 |
| 2009/0128992 | A1 | * | 5/2009 | Haralabidis | H01G 4/255 361/329 |

* cited by examiner

*Primary Examiner* — Kenneth B Wells
(74) *Attorney, Agent, or Firm* — McClure, Qualey & Rodack, LLP

(57) ABSTRACT

A N-path filter includes a plurality of switch-capacitor circuits controlled by a plurality of logical signals, respectively, and joined at a common shunt node, each of said switch-capacitor circuit comprising: a respective switch configured to controllably connect the common shunt node to a respective middle node in accordance with a respective logical signals among said plurality of logical signals; and a respective balanced MOS (metal oxide semiconductor) capacitor connected to the respective middle node, wherein the respective balanced MOS capacitor exhibits a capacitance at the respective middle node with reference to a power supply node and a ground node.

4 Claims, 5 Drawing Sheets

AREA EFFICIENT N-PATH FILTER

BACKGROUND OF THE DISCLOSURE

Field of the Disclosure

This present disclosure generally relates to N-path filters and more particularly to N-path filters of high area efficiency.

Description of Related Art

As depicted in FIG. 1A, a bandpass network 100 comprises a source network 110 configured to couple an input voltage signal $V_{in}$ to an output node 101, a load network 150 of a load impedance $Z_{150}$ configured to draw a load current $I_{load}$ from the output node 101, and an N-path filter 120 of a shunt impedance $Z_{120}$ configured to draw a shunt current $I_{sh}$ from the output node 101. An output voltage signal $V_{out}$ at the output node 101 depends on an impedance of the source network 110, the load impedance $Z_{150}$, and the shunt impedance $Z_{120}$. In an embodiment shown in FIG. 1B, the N-path filter 120 is a shunt network comprising a parallel connection of four switch-capacitor circuits 121, 122, 123, and 124 controlled by four logical signals LO1, LO2, LO3, and LO4, respectively. Switch capacitor circuit 121 (122, 123, 124) comprises a serial connection of a switch 141 (142, 143, 144) controlled by LO1 (LO2, LO3, LO4) and a capacitor 131 (132, 133, 134). The four logical signals LO1, LO2, LO3, and LO4 form a four-phase clock signal of a frequency $f_{LO}$. A frequency response of the shunt impedance $Z_{120}$ of the N-path filter 120 has a peak value at $f_{LO}$ and rolls off as the frequency deviates from $f_{LO}$.

Bandpass network 100 is often used in a zero-IF (intermediate frequency) radio receiver front-end to suppress an undesired blocker of a frequency that deviates from a frequency of a desired signal to be received, wherein the four-phase clock signal is generated by a local oscillator of an oscillation frequency tuned to the frequency of the desired signal to be received. Consider a case where an impedance of the source network 110 is substantially constant in a frequency range of interest around $f_{LO}$. In such a case, a larger value of $Z_{120}$ leads to a less amount of the shunt current $I_{sh}$ being shunted away from the output node 101 and thus a higher level of the output voltage signal $V_{load}$. As a result, bandpass network 100 can provide a bandpass response with a center frequency at $f_{LO}$. A principle of N-pass filter 120 and how it can be used to embody a bandpass filter is well known in the prior art and thus not further described in detail here. A bandwidth of the bandpass network 100 is determined by the load impedance $Z_{150}$ and the shunt impedance $Z_{120}$ (assuming an impedance of the source network 110 is substantially constant in a frequency range of interest around $f_{LO}$). To have a narrow bandwidth, capacitors 131, 132, 133, and 134 must be sufficiently large. In a case of interest, the bandpass network 100 is integrated on a silicon substrate using a CMOS (complementary metal oxide semiconductor) process technology, wherein capacitors 131, 132, 133, and 134 can be embodied by a MOM (metal-oxide-metal) capacitor or a MOS (metal-oxide semiconductor) capacitor that is constructed by connecting a source to a drain of a MOS transistor. A MOS capacitor has a higher density and thus more area efficient. However, a capacitance of a MOS capacitor is not fixed but varies in accordance with a voltage applied to the MOS transistor. To be specific, a capacitance of a MOS capacitor increases when an absolute value of a gate-to-source voltage of the MOS transistor increases. Therefore, if a MOS capacitor were to be instantiated to embody capacitors 131, 132, 133, and 134, the shunt impedance $Z_{120}$ will vary with the output voltage signal $V_{out}$ and cause a nonlinear distortion.

What is desired is an N-phase filter that is area efficient but does not suffer from nonlinear distortion.

SUMMARY OF THE DISCLOSURE

In an embodiment, an N-path filter comprises a plurality of switch-capacitor circuits controlled by a plurality of logical signals, respectively, and joined at a common shunt node, each of said switch-capacitor circuit comprising: a respective switch configured to controllably connect the common shunt node to a respective middle node in accordance with a respective logical signals among said plurality of logical signals; and a respective balanced MOS (metal oxide semiconductor) capacitor connected to the respective middle node, wherein the respective balanced MOS capacitor exhibits a capacitance at the respective middle node with reference to a power supply node and a ground node, wherein N is an integer greater than 1.

DETAILED DESCRIPTION OF THIS DISCLOSURE

Figure 1A:
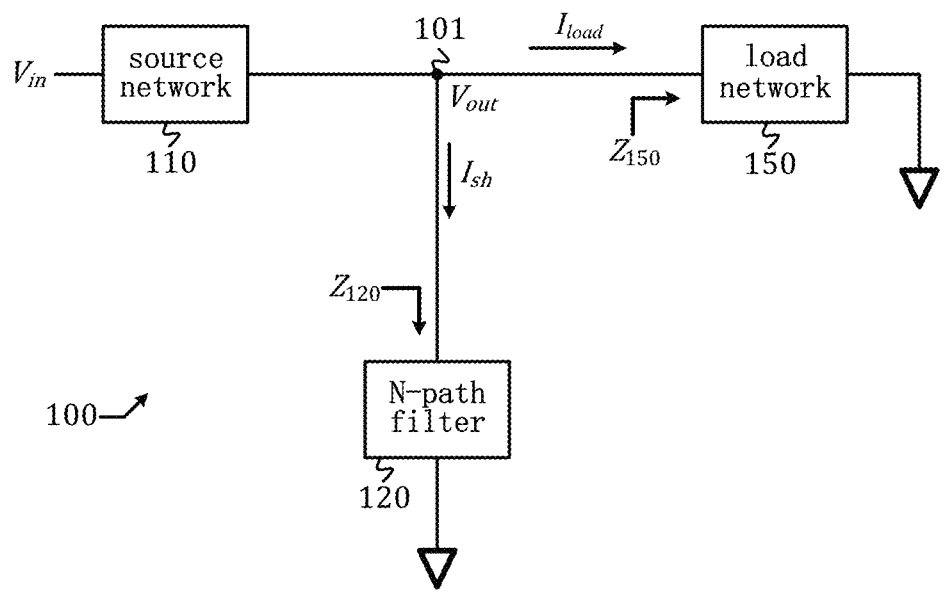
FIG. 1A shows a schematic diagram of a prior art bandpass network including a N-path filter.

The present disclosure is directed to N-path filters. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "clock signal," "frequency," "phase," "load," "shunt," "zero-IF (intermediate frequency) radio receiver," "bandpass filter," "switch," "capacitor," "shunt," "parallel connection," "circuit node," "ground," "DC (direct current)," "AC (alternate current)," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skill in the art understand units such as pF (pico-Farad), nm (nanometer), and μm (micron) without the need for explanation.

Those of ordinary skill in the art can read schematics of a circuit comprising electronic components such as inductors, capacitors, resistors, NMOS transistors, PMOS transistors, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of a transistor, a capacitor, a resistor, and/or other electronic devices inter-connected in a certain manner to embody a certain function.

A network is a circuit or a collection of circuits.

A power supply node is a circuit node of a substantially stationary voltage, and so is a ground node. Power supply node and ground node are both DC (direct current) nodes but differ in voltage level; that is, a voltage level of a power supply node is higher than a voltage level of a ground node. Following a convention widely used in the literature, in this disclosure, in a circuit, "$V_{DD}$" denotes a power supply node and "$V_{SS}$" denotes a ground node. Although a DC level of a ground node is usually 0V, it doesn't have to be 0V. What matters principally is a voltage difference between the power supply node and the ground node. For a given circuit, a behavior of that circuit remains the same if a DC voltage level is raised by the same amount for all nodes. Therefore, in the appendix claims, we use "a first DC node" to describe a ground node, and "a second DC node" to describe a power supply node.

In this disclosure, a "circuit node" is frequently simply stated as a "node" for short, when what it means is clear from a context.

A signal is a voltage of a variable level that carries a certain information and can vary with time. A level of the signal at a moment represents a state of the signal at that moment. In this present disclosure, "signal" and "voltage signal" refer to the same thing and thus are interchangeable.

A logical signal is a voltage signal of two states: a low state and a high state; the logical signal is in the high state when its voltage level is above a trip point and in the low state otherwise. The low state is also referred to as a "0" state, while the high stage is also referred to as a "1" state. Regarding a logical signal Q, "Q is high" or "Q is low" means that "Q is in the high state" or "Q is in the low state." Likewise, "Q is 1" or "Q is 0" means that "Q is in the 1 state" or "Q is in the 0 state."

A first logical signal may not necessarily have the same trip point as a second logical signal.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A logical signal is often used as a control signal to enable or disable a function of a circuit. When the logical signal is in a logical state that enables the function of the circuit, the logical signal is said to be "asserted"; otherwise, the logical signal is said to be "de-asserted." When a logical signal is "asserted" when it is high, it is said to be "active high"; when a logical signal is "asserted" when it is low, it is said to be "active low."

Switches are extensively used in the present disclosure. A switch is a device configured to controllably connect a first node to a second node in accordance with a control by a logical signal; said switch is turned on and behaves like a short circuit when said logical signal is asserted; and said switch is turned off and behaves like an open circuit when said logical control signal is de-asserted.

A switch can be embodied by an NMOS transistor with a gate voltage controlled by an active high logical signal, while a first node and a second node connect to a source and a gate of the NMOS transistor, respectively; in this case, a trip point of the active high logical signal is equal to a source voltage at the first node plus a threshold voltage of the NMOS transistor.

Alternatively, a switch can be embodied by a PMOS transistor with a gate voltage controlled by an active low logical signal, while a first node and a second node connect to a source and a gate of the PMOS transistor, respectively; in this case, a trip point of the active low logical signal is equal to a source voltage at the first node minus a threshold voltage (which is a positive voltage per the convention used in the present disclosure) of the PMOS transistor.

Further still, a switch can be embodied by using a parallel connection of an NMOS transistor with a gate voltage controlled by an active high logical signal and a PMOS transistor with a gate voltage controlled by an active low logical signal, wherein the active high logical signal and active low logical signal are complementary. This is known as a "transmission gate" and well understood by those of ordinary skill in the art and thus not described in detail here.

A clock signal is a periodic logical signal that cyclically toggles back and forth between a low state and a high state. A multi-phase clock signal comprises a plurality of clocks signals that are of the same frequency and waveform but evenly displaced in time.

Figure 1B:
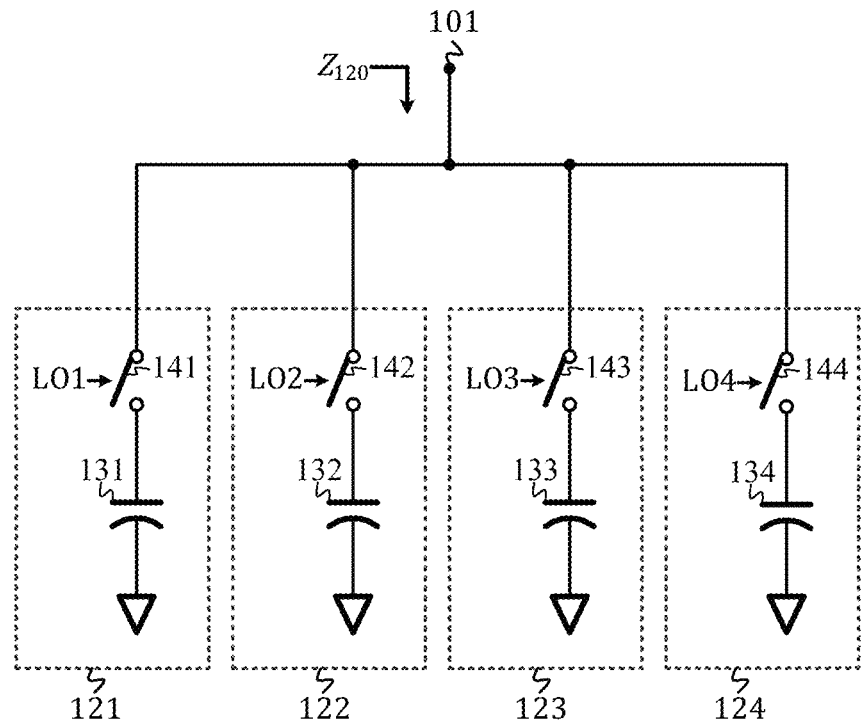
FIG. 1B shows a schematic diagram of a prior art N-path filter.
Figure 2:
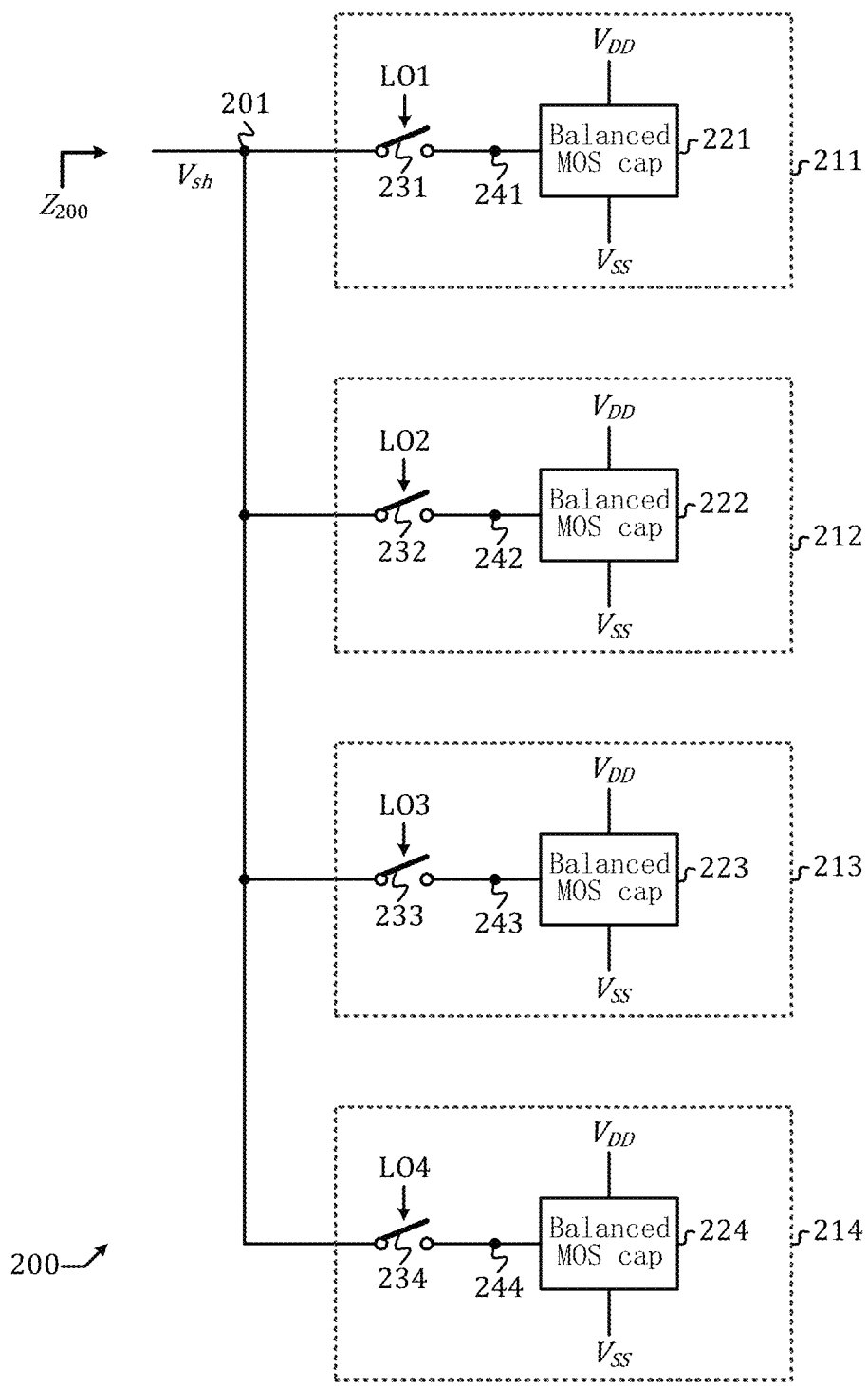
FIG. 2 shows a schematic diagram of an N-path filter in accordance with an embodiment of the present disclosure.

As shown in FIG. 2, an N-path filter 200 in accordance with an embodiment of the present disclosure comprises four switch-capacitor circuits 211, 212, 213, and 214 joined at a common shunt node 201. Switch capacitor circuit 211 (212, 213, 214) comprises: a switch 231 (232, 233, 234) configured to controllably connect the common shunt node 201 to a middle node 241 (242, 243, 244) in accordance with a logical signal LO1 (LO2, LO3, LO4); and a balanced MOS capacitor 221 (222, 223, 224) configured to provide a capacitance at the middle node 241 (242, 243, 244) with reference to both a power supply node $V_{DD}$ and a ground node $V_{SS}$. The four logical signals LO1, LO2, LO3, and LO4 form a four-phase clock signal of a frequency $f_{LO}$. The N-path filter 200 can be used to replace the N-path filter 120 in the bandpass network 100 of FIG. 1A; when doing so, the shunt node 201 in FIG. 2 is the same as the output node 101 in FIG. 1A, and a shunt voltage signal $V_{sh}$ at the shunt node 201 is the same as the output voltage signal Vou. Like the N-path filter 120, a frequency response of a shunt impedance $Z_{200}$ of the N-path filter 200 has a peak value at $f_{LO}$ and rolls off as the frequency deviates from $f_{LO}$. A major difference between the N-phase filter 200 and the N-path filter 120 of FIG. 1B is that a balanced MOS capacitor is used. A balanced MOS capacitor has two distinct features. First, it is a combination of a lower-side capacitor with reference to a ground node and a higher-side capacitor with reference to a power supply node. Second it employs a complementary topology, wherein an increase of a capacitance of the lower-side capacitor always accompanies a decrease of a capacitance of the upper-side capacitor, and vice versa. As a result, a total capacitance has a voltage dependency that is substantially symmetrical around a midway voltage between the power supply node and the ground node. Numerous circuits can embody a balanced MOS capacitor and will be described as follows.

Figure 3A:
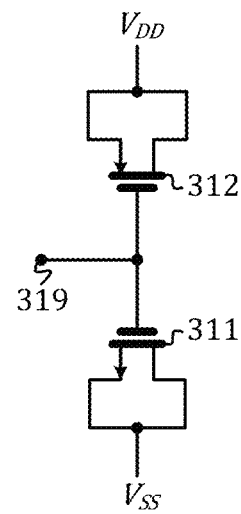
FIG. 3A shows a schematic diagram of a first embodiment of a balanced MOS capacitor.

In a first embodiment shown in FIG. 3A, a balanced MOS capacitor 310 comprises an NMOS transistor 311 and a PMOS transistor 312. A source and a drain of NMOS transistor 311 connect to the ground node $V_{SS}$, while a gate of NMOS transistor 311 connects to a middle node 319. A source and a drain of PMOS transistor 312 connect to the power supply node $V_{DD}$, while a gate of PMOS transistor 312 connects to the middle node 319.

Figure 3B:
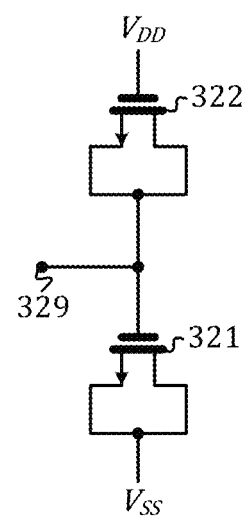
FIG. 3B shows a schematic diagram of a second embodiment of a balanced MOS capacitor.

In a second embodiment shown in FIG. 3B, a balanced MOS capacitor 320 comprises a first NMOS transistor 321 and a second NMOS transistor 322. A source and a drain of NMOS transistor 321 connect to the ground node $V_{SS}$, while a gate of NMOS transistor 321 connects to a middle node 329. A source and a drain of NMOS transistor 322 connect to the middle node 329, while a gate of NMOS transistor 312 connects to the power supply node $V_{DD}$.

Figure 3C:
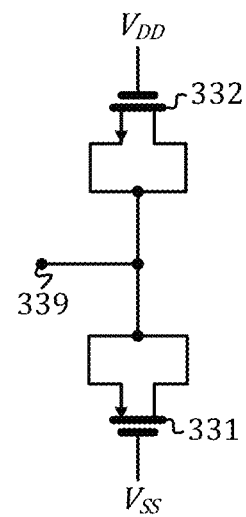
FIG. 3C shows a schematic diagram of a third embodiment of a balanced MOS capacitor.

In a third embodiment shown in FIG. 3C, a balanced MOS capacitor 330 comprises a PMOS transistor 331 and an NMOS transistor 332. A source and a drain of PMOS transistor 331 connect to a middle node 339, while a gate of PMOS transistor 331 connects to the ground node $V_{SS}$. A source and a drain of NMOS transistor 332 connect to the middle node 339, while a gate of NMOS transistor 332 connects to the power supply node $V_{DD}$.

Figure 3D:
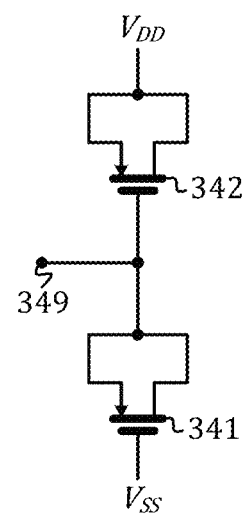
FIG. 3D shows a schematic diagram of a fourth embodiment of a balanced MOS capacitor.

In a fourth embodiment shown in FIG. 3D, a balanced MOS capacitor 340 comprises a first PMOS transistor 341 and a second PMOS transistor 342. A source and a drain of PMOS transistor 341 connect to a middle node 349, while a gate of PMOS transistor 341 connects to the ground node $V_{SS}$. A source and a drain of PMOS transistor 342 connect to the power supply node $V_{DD}$, while a gate of PMOS transistor 342 connects to the middle node 349.

Each of the four balanced MOS capacitors 310, 320, 330, and 340 comprises: a lower-side MOS transistor configured to embody a lower-side capacitor; and an upper-side MOS transistor configured to embody an upper-side capacitor. When a voltage at the middle node of the balanced MOS capacitor rises (falls), an absolute value of a gate-to-source voltage of the lower-side MOS transistor increases (decreases), resulting in an increase (decrease) of the capacitance of the lower-side MOS transistor; in the meanwhile, an absolute value of a gate-to-source voltage of the upper-side MOS transistor decreases (increases), resulting in a decrease (increase) of the capacitance of the upper-side MOS transistor.

Any one of the four balanced MOS capacitors 310, 320, 330, and 340 can be instantiated to embody the four balanced MOS capacitors 221, 222, 223, and 224.

Figure 4:
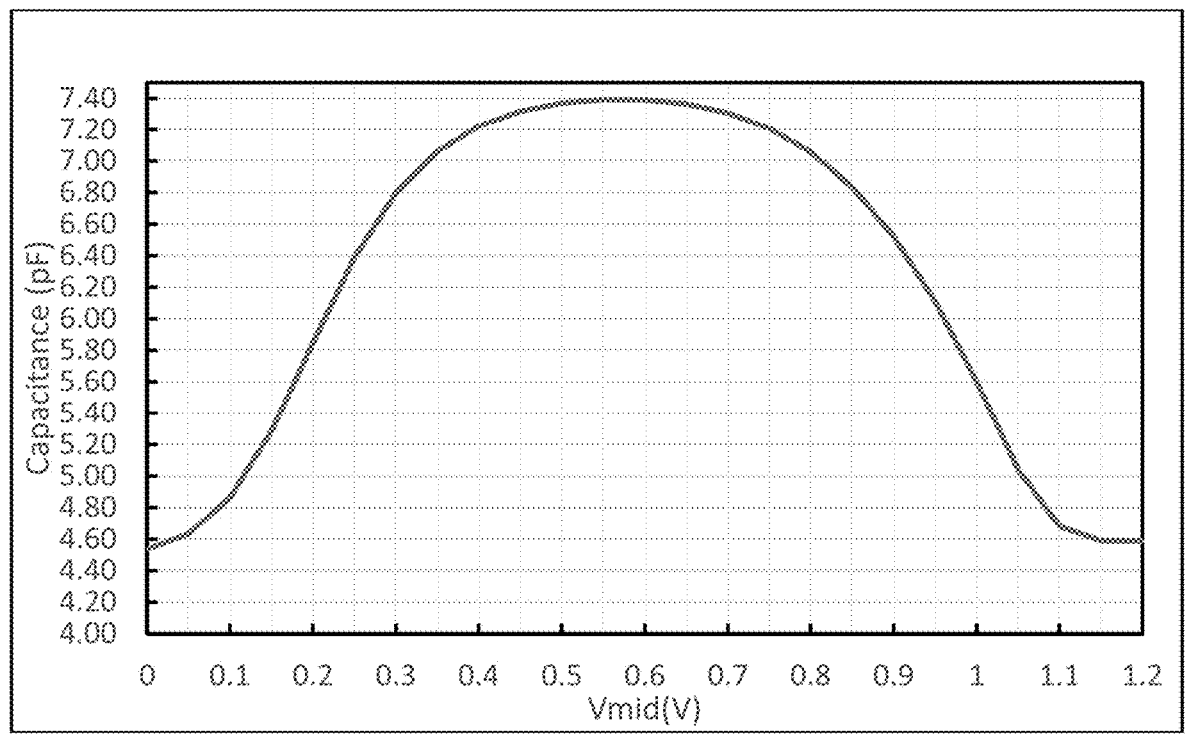
FIG. 4 shows a capacitance versus middle voltage of the balanced MOS capacitor of FIG. 3A.

By way of example but not limitation: a 55 nm CMOS process technology is used; $V_{DD}$ is 1.2V; $V_{SS}$ is 0V; the balanced MOS capacitor 310 of FIG. 3A is instantiated to embody the four balanced MOS capacitors 221, 222, 223, and 224; a W/L (which stands for width/length) of NMOS transistor 311 is 392*1 μm/1 um; and a W/L (which stands for width/length) of PMOS transistor 312 is 392*1 μm/1 um. A capacitance of the balanced MOS capacitor 310 as a function of a voltage $V_{mid}$ at the middle node 319 is shown in FIG. 4. The capacitance is symmetrical around 575 mV, which is said to be a common-mode voltage of the balanced MOS capacitor 310. Although the capacitance is clearly nonlinear, the nonlinearity is of an even order due to the symmetry. In an embodiment, the shunt voltage signal $V_{sh}$ is an AC (alternate current) signal of a DC (direct current) level equal to the common-mode voltage of the balanced MOS capacitor 310. A capacitance of the N-path filter 200 during a positive half of the shunt voltage signal $V_{sh}$ (where $V_{sh}$ is above the common-mode voltage) will be equal to a capacitance of the N-path filter 200 during a negative half of the shunt voltage signal $V_{sh}$ (where $V_{sh}$ is below the common-mode voltage). As a result, the effect of the nonlinearity of the N-path filter 200 is balanced and the N-path filter 200 does not introduce an even-order distortion to the shunt voltage $V_{sh}$. In an embodiment, N-path filter 200 is used in a zero-IF receiver frontend. As known in the prior art, even-order distortion caused by a strong undesired blocker is often the most serious impairment in a zero-IF receiver. The N-path filter 200, however, does not introduce an even-order distortion. Therefore, despite having a nonlinear capacitance, N-path filter 200 can be used in a zero-IF receiver front end. As a result of using MOS capacitors, the N-path 200 can be highly area efficient.

Although it is shown in FIG. 2 that N-path filter 200 comprises four switch-capacitor circuits 211, 212, 213, and 214 controlled by four logical signals LO1, LO2, LO3, and LO4, respectively, wherein LO1, LO2, LO3, and LO4 form a four-phase clock signal. This is merely an example, and not a limitation on the embodiment. In general, the N-path filter 200 can comprise a plurality of switch-capacitor circuits controlled by a plurality of logical signals, respectively, wherein said plurality of logical signals are of the same frequency but evenly displaced in time to form a multi-phase clock signal.

In a CMOS process technology, a MOS capacitor can also be embodied by a device called a "varactor," which is a type of MOS device and has two types: an n-type varactor and a p-type varactor. An n-type varactor behaves like an NMOS transistor with a source and a drain being connected. A p-type varactor behaves like a PMOS transistor with a source and a drain being connected. A varactor is considered an embodiment of a MOS capacitor.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An N-path filter comprising a plurality of switch-capacitor circuits controlled by a plurality of logical signals, respectively, and joined at a common shunt node, each of said switch-capacitor circuits comprising:

a switch configured to controllably connect the common shunt node to a respective middle node in accordance with a respective logical signal among said plurality of logical signals; and a balanced MOS (metal oxide semiconductor) capacitor connected to the respective middle node, wherein the respective balanced MOS capacitor exhibits a capacitance at the respective middle node with reference to both a first DC (direct current) node and a second DC node, and a voltage level of the respective middle node is higher than a voltage level of the first DC node but lower than a voltage level of the second DC node, wherein N is an integer greater than 1, wherein said plurality of logical signals form a multi-phase clock signal, wherein the capacitance at the respective middle node depends on a voltage at the respective middle node and is symmetrical around a common-mode voltage level, wherein the respective balanced MOS capacitor comprises: a lower-side capacitor comprising a first MOS transistor inserted between the respective middle node and the first DC node, with a source and a drain of the first MOS transistor being connected; and an upper-side capacitor comprising a second MOS transistor inserted between the second DC node and the respective middle node, with a source and a drain of the second MOS transistor being connected, and wherein: the first MOS transistor is a PMOS (p-channel metal oxide semiconductor) transistor, the source and a gate of which connect to the respective middle node and the first DC node, respectively; and the second MOS transistor is an NMOS (n-channel metal oxide semiconductor) transistor, the source and a gate of which connect to the respective middle node and the second DC node, respectively.

2. The N-path filter of claim 1, wherein: the first MOS transistor is an NMOS (n-channel metal oxide semiconductor) transistor, the source and a gate of which connect to the first DC node and the respective middle node, respectively; and the second MOS transistor is a PMOS (p-channel metal oxide semiconductor) transistor, the source and a gate of which connect to the second DC node and the respective middle node, respectively.

3. The N-path filter of claim 1, wherein: the first MOS transistor is a first NMOS (n-channel metal oxide semiconductor) transistor, the source and a gate of which connect to the first DC node and the respective middle node, respectively; and the second MOS transistor is a second NMOS transistor, the source and a gate of which connect to the respective middle node and the second DC node, respectively.

4. The N-path filter of claim 1, wherein: the first MOS transistor is a first PMOS (n-channel metal oxide semiconductor) transistor, the source and a gate of which connect to the respective middle node and the first DC node, respectively; and the second MOS transistor is a second PMOS transistor, the source and a gate of which connect to the second DC node and the respective middle node, respectively.

* * * * *